US006135786A

United States Patent [19]
Johnson et al.

[11] Patent Number: 6,135,786

[45] Date of Patent: Oct. 24, 2000

[54] REMOVABLE MODULAR CONNECTOR FOR CONNECTING AN ELECTRONIC DEVICE TO A COMMUNICATIONS CARD

[75] Inventors: Thomas A. Johnson, Draper; David D. Oliphant, West Valley City, both of Utah

[73] Assignee: 3Com Corporation, Santa Clara, Calif.

[21] Appl. No.: 09/201,679

[22] Filed: Nov. 30, 1998

[51] Int. Cl.[7] .............................. H01R 12/00; H05K 1/00

[52] U.S. Cl. .......................... 439/76.1; 439/131; 439/946

[58] Field of Search .................................... 439/76.1, 131, 439/945, 946.2

[56] References Cited

U.S. PATENT DOCUMENTS

| | | | |
|---|---|---|---|
| 2,916,720 | 12/1959 | Steans . | |
| 4,186,988 | 2/1980 | Kobler . | |
| 4,241,974 | 12/1980 | Hardesty . | |
| 4,303,296 | 12/1981 | Spaulding . | |
| 4,352,492 | 10/1982 | Smith | 273/1 |
| 4,407,559 | 10/1983 | Meyer . | |
| 4,428,636 | 1/1984 | Kam et al. . | |
| 4,710,136 | 12/1987 | Suzuki | 439/374 |
| 4,778,410 | 10/1988 | Tanaka | 439/676 |
| 4,915,648 | 4/1990 | Takase et al. | 439/490 |
| 5,035,641 | 7/1991 | Van-Santbrink et al. | 439/329 |
| 5,051,099 | 9/1991 | Pickles et al. | 439/108 |
| 5,139,439 | 8/1992 | Shie | 439/359 |
| 5,183,404 | 2/1993 | Aldous et al. | 439/55 |
| 5,184,282 | 2/1993 | Kaneda et al. | 361/395 |
| 5,336,099 | 8/1994 | Aldous et al. | 439/131 |
| 5,338,210 | 8/1994 | Beckham et al. | 439/131 |
| 5,391,094 | 2/1995 | Kakinoki et al. | 439/638 |
| 5,411,405 | 5/1995 | McDaniels et al. | 439/539 |
| 5,481,616 | 1/1996 | Freadman | 381/90 |
| 5,499,923 | 3/1996 | Archibald et al. | 439/26 |
| 5,505,633 | 4/1996 | Broadbent | 439/329 |
| 5,509,811 | 4/1996 | Homic | 439/55 |
| 5,538,442 | 7/1996 | Okada | 439/676 |
| 5,547,401 | 8/1996 | Aldous et al. | 439/676 |
| 5,561,727 | 10/1996 | Akita et al. | 385/88 |
| 5,562,504 | 10/1996 | Moshayedi | 439/638 |
| 5,608,607 | 3/1997 | Dittmer | 361/686 |
| 5,634,802 | 6/1997 | Kerklaan | 439/131 |
| 5,660,568 | 8/1997 | Moshayedi | 439/654 |
| 5,667,395 | 9/1997 | Okada et al. | 439/131 |
| 5,679,013 | 10/1997 | Matsunaga et al. | 439/144 |
| 5,727,972 | 3/1998 | Aldous et al. | 439/655 |
| 5,773,332 | 6/1998 | Glad | 439/344 |
| 5,797,771 | 8/1998 | Garside | 439/610 |
| 5,816,832 | 10/1998 | Aldous et al. | 439/131 |

FOREIGN PATENT DOCUMENTS

| | | |
|---|---|---|
| 61-256850 | 11/1986 | Japan . |
| WO 95/13633 | 5/1995 | WIPO . |

OTHER PUBLICATIONS

P.E. Knight and D.R. Smith, "Electrical Connector for Flat Flexible Cable," IBM Technical Disclosure Bulletin, vol. 25, No. 1, Jun. 1982.

*Primary Examiner*—Neil Abrams
*Assistant Examiner*—Hae Moon Hyeon
*Attorney, Agent, or Firm*—Workman, Nydegger & Seeley

[57] ABSTRACT

A removable modular connector housing is disclosed and claimed for use in an electronic device and two devices that are insertable in the modular removable connect or integral thereto. The removable connector is particularly suited for insertion within a thin-architecture communications card such as a PCMCIA card. A standard interface scheme between the removable modular connector includes a multiple-pin socket and/or a multiple-runner array that is external to the housing of the removable modular connector. The removable modular connector is suited for various types of devices including land line jacks, video interfaces, cable connects, and other electronic devices that are connectable to larger systems such as computers, cameras, and hand-held digital assistants.

38 Claims, 9 Drawing Sheets

REMOVABLE MODULAR CONNECTOR FOR CONNECTING AN ELECTRONIC DEVICE TO A COMMUNICATIONS CARD

BACKGROUND OF THE INVENTION

1. The Field of the Invention

The present invention relates to a removable modular connector for use in an electronic device and to devices that are insertable in the removable modular connector or integral thereto. The present invention also relates to a variety of devices such as an RJ-45 removable jack, an interface cable connection, an infrared receive and transmit device, a video interface, and others. The removable modular connector is standardizable to receive or incorporate any and all of the above-mentioned devices.

2. The Relevant Technology

As technology increasingly depends upon electronics, the interconnectability of electronic devices has become more prevalent. One may now utilize a cellular telephone to provide a data link with a laptop computer through a modem. Digital still cameras and video cameras may be connected to a computer or to a video monitor. Portable computers are used to access the Internet and may also be connected to local area networks, wide area networks, and intranets. Because portable computers by definition have the capability of being transported between locations, it is important to be able to reconnect a portable computer to other electronic devices upon reaching a new location.

To assist in the interconnectivity of electronic devices to computers, standards such as the Personal Computer Modem Card International Association card (PCMCIA card) and PC card standards have been agreed upon. The standard dictates the size of memory and the physical size of the communication card so that the card may be interchanged between computers. The card provides a standard connection at one end which integrates with the printed circuit board of the computer and provides some connection scheme at the other end to allow interconnectability with cables such as telephone lines, network lines and peripheral devices such as the cellular phone discussed previously. Unfortunately, while the connection between the PCMCIA card and the computer has been standardized, the interconnection between the PCMCIA card and the outside world is not standardized and many incompatible schemes have been developed.

Similarly, devices which in the past have not required connectivity as a criterion for their design, have now evolved into a digital format which allows for much greater compatibility than in the past. Interconnectability between still cameras and video cameras with computers and video monitors was not necessary before the advent of the digital format in cameras. Before wireless modems, portable computers were forced to attach only to land line telephones. Person Digital Assistants (PDAs) are now used to carry telephone numbers, addresses and provide rudimentary operating systems to run compiled software programs. These PDAs may often be synchronized with other computers. Some PDAs also synchronize with cell phones to program the telephone numbers stored in the PDA into the cellular telephone. Satellite telephones may also be connected to computers. Automobiles now provide emergency services through the use of built-in cellular telephones. Some of these systems provide interconnection between the cellular phone and a diagnostics system now available on some automobiles.

Because standards of interconnectability have not kept pace with the advent of compatible products, it has become increasingly difficult to own several electronic devices without also purchasing several adapters and cords to provide interconnectivity between those devices.

Not everyone perceives the same need to own interconnectable electronic devices, however, some manufactures have been reluctant to build-in features that allow interconnectability and that incur the increased costs associated with that interconnectability when only a portion of the consumers of that device will require that feature. Such manufactures have been forced to provide several products to satisfy the needs of consumers. These manufacturers typically provide a low end product which is not interconnectable and several high end products featuring several of the most popular methods of connection.

What is needed in the art is a removable modular connector that overcomes the problems of the prior art. It would therefore be an advancement in the art to provide a system for interconnect modularity with an electronic communication card or a mother board that standardizes the electronic link for a variety of devices such as interconnects, transceivers, video units, and the like.

It would be an advancement in the art to provide a system for interconnect modularity with a PCMCIA card that provides a locking mechanism therefore, and that standardizes the electronic link for a variety of devices such as interconnects, transceivers, video units, and the like.

Such a removable connector, connector ports, electronic devices, and systems are disclosed as claimed herein.

SUMMARY AND OBJECTS OF THE INVENTION

The present invention relates to a removable modular connector for an electronic device such as a computer, a digital camera, or a hand-held device. The present invention relates to a multimedia and interconnection port that may house such devices as an RJ-11 removable jack, an interface cable connection, an infrared receive and transmit port, a video interface, and other devices that may be connectable to a PCMCIA card or directly connectable to a mother board.

In general, the present invention relates to a system for interconnect modularity on an electronic communication card. One embodiment of the electronic communication card is a PCMCIA card. The system includes a printed circuit board (PCB) and a removable connector with a multiple-pin connector that makes electrical contact with the PCB. Within the removable connector, a PCB may also be located that has a PCB finger and a peninsular electrical lead configuration upon the PCB finger. At least one electrical lead terminates at or near the end of the PCB finger. Additionally, the inventive system may have an electronic device or slidable member that is slidably disposed upon the peninsular electrical lead configuration. Thereby, the electronic device or slidable member makes electrical contact with the peninsular electrical lead configuration. An example thereof is a tip and ring terminus on the PCB and corresponding electrical runners from the electronic device that slidably make contact with the peninsular tip and ring leads. Where the removable connector is part of a communication device, all of the tip and ring circuitry is located within the connect. Additionally, the Data Access Arrangement (DAA) circuitry is located within the connect.

Examples of electronic devices include interconnects such as an RJ-11 jack, and an RJ-45 jack. These interconnects have runners that make electrical contact to the peninsular electrical lead configuration and that are slidably in contact therewith. Another example of the electronic device is an IRDA transceiver. The IRDA transceiver has runners that make electrical contact with leads from the peninsular electrical lead configuration and is slidably disposed thereupon. Another example of an electronic device is an electronic video interface. As with the other electronic devices, electrical runner contacts extend from the electronic video interface and are slidably disposed upon the peninsular electrical lead configuration.

The peninsular electrical lead configuration may have up to eight or more electrical leads upon its upper surface. Additionally, it may have up to eight or more electrical leads upon its lower surface. In general, therefore, the PCB may have at least two electrical leads, at least one of which is upon the upper surface of the PCB and at least one of which is upon the lower surface of the PCB. The PCB is preferably flat, having upper and lower surfaces that are substantially parallel planar. The peninsular electrical lead configuration is preferably laid out upon a finger of a PCB that is suspended above the floor and ceiling within the removable modular connector to facilitate interchangeability of parts.

Another embodiment of the present invention includes any of the above configurations of structures and combinations and the electronic device that makes contact with the peninsular electrical lead configuration, and additionally has a housing, a shell, or a portion thereof which may be translucent. The translucent housing, shell, or portion thereof is configured to receive light energy from a light source that is mounted upon the PCB within the removable modular connector. A preferred light source may include a light emitting diode (LED). It may also include an incandescent light.

The inventive removable modular connector system is particularly useful for interconnect modularity of an electronic communication card such as a PCMCIA card with various preferred devices. Plan-view footprint standardization according to the present invention provides that any electronic device that makes contact with the peninsular electrical lead configuration has substantially the same plan-view footprint regardless of the type of electronic device that is disposed thereupon. Generally speaking, this standard plan-view footprint is understood to be that portion of any electronic device that is insertable along the peninsular electrical lead configuration of the connect. In particular, a preferred plan-view footprint may comprise a first rectangle and second rectangle that are intersecting. The first rectangle generally contains the majority of the structure of the electronic device, and the second rectangle, being shorter and narrower than the first rectangle, orthogonally intersects the second rectangle and is configured to make a partially enclosed physical connection with a guide rail structure that may be part of the removable modular connector or that may be part of the electronic communication card. Additionally, other electrical circuitry may be found upon the PCB of the removable modular connector that is adjacent and/or behind the electronic device. The guide rail structure may be an integral part of the connect or it may be part of the greater electronic device into which the connect is slid. The partially enclosed sliding structure may be configured to have at least one and preferably two locking mechanisms that securely hold the electronic device in the electronic communication card.

Any portion of an electronic device that is not insertable within the geometry of the removable modular connector, extends beyond it and is generally exposed to the user's view. An example of such an electronic device is a cable connector.

In one embodiment, a universal connector module that comprises the removable modular connector housing is capable of being inserted into a device so as to provide connectivity with a cable or another device. The module is provided with guides along its edges which cooperate with channels formed within the device to accept the connector module. The module provides at one end electrical connections for interfacing between the parent device and the module. The module also provides at another end electrical connections for connecting the module to any of the standardized connection schemes currently utilized for connection of cables and other devices.

It would therefore be an object of the present invention to provide a removable modular connector module which allows manufacturers to engineer one design which provides the opportunity for connectivity through many connection schemes.

Another object of the present invention is to provide a connection module with a standardized interface providing the capability of connection to many electronic devices.

It is another object of the present invention to provide a connection module which would allow a communications card to be connected to a telephone line, and have the same communications card also be able to be connected to a local area network line merely by exchanging the modular connector.

It is another object of the present invention to provide many modular connectors which are interchangeable thereby allowing two electronic devices to be interconnected.

It is another object of the present invention to provide a removable modular connector so that many devices may utilize the same module so that the module need not be sold with the device but is available to provide connectivity if such interconnectivity is later desired.

It is another object of the present invention to provide a connection module which uses very little space and which is self-contained and which provides easy conductivity to standard cables.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained, a more particular description of the invention briefly described above will be rendered by reference to a specific embodiment thereof which is illustrated in the appended drawings. Understanding that these drawings depict only a typical embodiment of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention relates to a removable modular connector removable connect that may house such devices as a removable jack, an interface cable connection, an infrared receive and transmit port, a video interface, and other devices that may be connectable to an electronic communication card. The device housed therein may itself be removable from the removable modular connector or it may be integral thereto.

Figure 1:
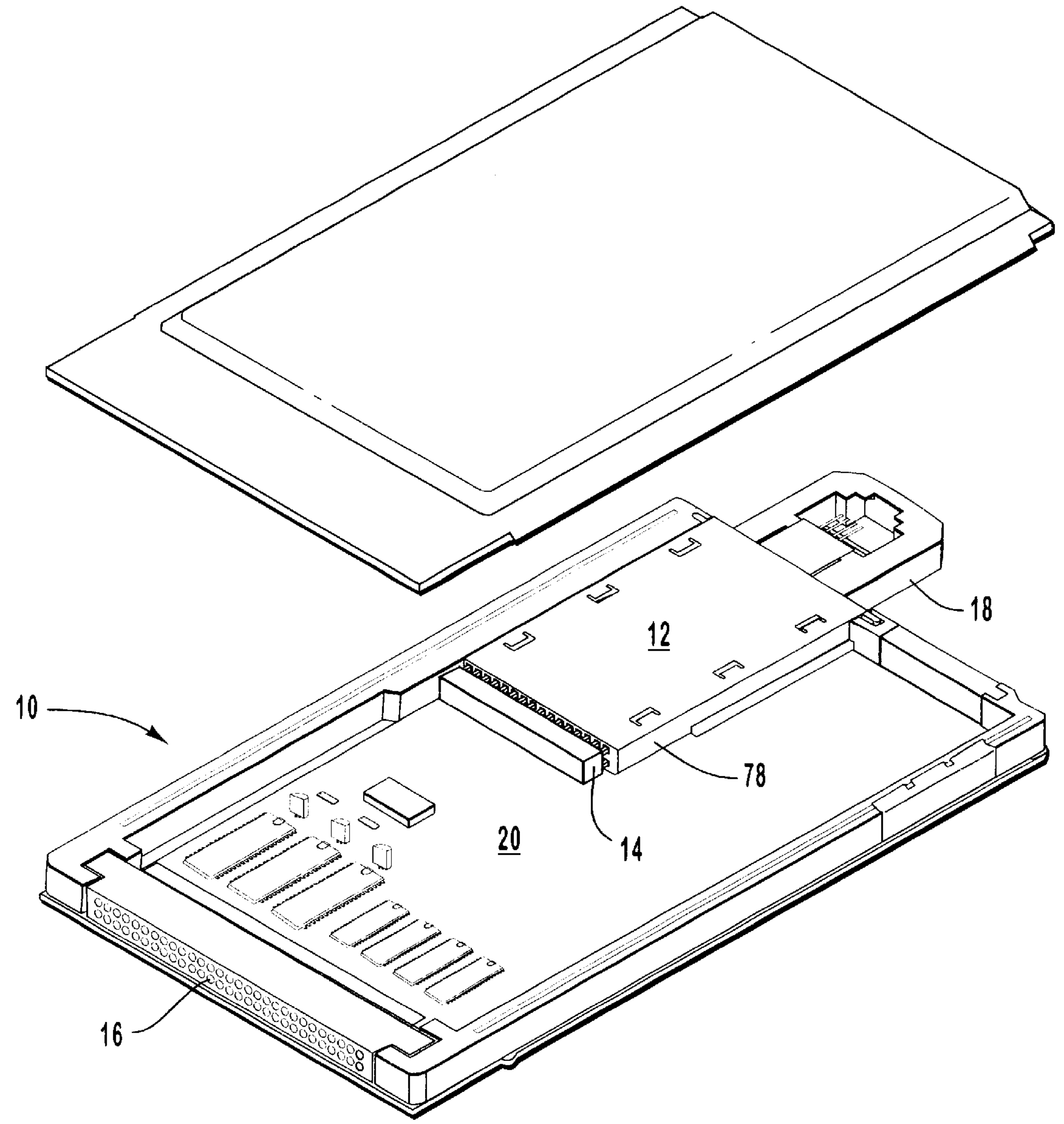
FIG. 1 is perspective view of a removable modular connector that is mounted within a communication card such as a PCMCIA card.

FIG. 1 is a perspective view of a thin-architecture communication card 10 including a removable modular connector 12 that is slidably disposed upon a printed circuit board (PCB) 20. Removable modular connector 12 is illustrated in FIG. 1 as having a multiple-pin socket 14 located internally within thin-architecture communication card 10. Thin-architecture communication card 10 itself has a 68-pin socket 16 or the like. At the other end of removable modular connector 12, opposite multiple-pin socket 14, FIG. 1 illustrates one embodiment of the present invention, wherein a jack 18 is depicted as being extended out of removable modular connector 12.

Figure 2:
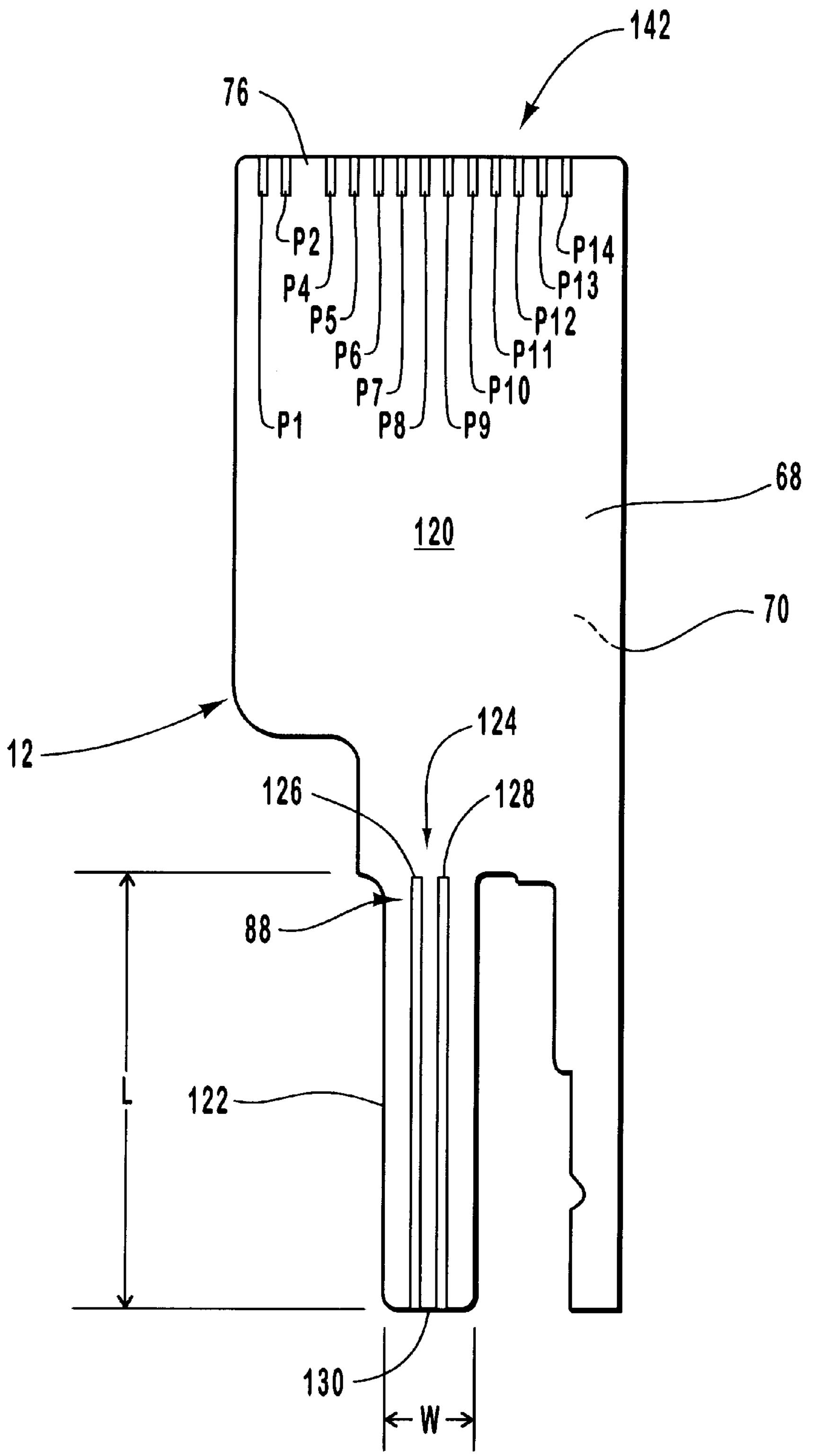
FIG. 2 is plan view illustration of a printed circuit board with a finger thereof that is part of the present invention.

FIG. 2 is a plan view of a portion of removable modular connector 12, wherein it is seen that a printed circuit board (PCB) 120 has a PCB finger 122 section and a peninsular electrical lead configuration 124 disposed upon PCB finger 122. Peninsular electrical lead configuration 124 may include a first lead 126 and a second lead 128. Peninsular electrical lead configuration 124 has a length L and a width W. PCB finger 122 has a terminus 130 that is one end defining length L.

Peninsular electrical lead configuration 124 may comprise at least one lead that acts as an electrical trace upon PCB finger 122. As can be seen in FIG. 2, first lead 126 and second lead 128 are depicted. However, as many as eight leads or more may be found upon one surface of PCB 120. It is also seen that leads 142 are provided that may make contact to multiple-pin socket 14 depicted in FIG. 1. Alternatively, leads 142 may be configured upon the upper surface 68 of PCB 120 or the lower surface 70 of PCB 120 to make sliding contact with lead traces that are similar to first lead 126 and second lead 128 upon a larger structure such as PCB 20. Such lead traces are located upon PCB 20 or the like. In this way, the presence of a multiple-pin socket such as multiple-pin socket 14 may be optional. Leads 142 may have a configuration such as upper and lower runners that make contact to traces disposed upon PCB 20 similar to first lead 126 and second lead 128 as will be discussed below. In greater detail, if the leads 142 are connected to the multiple-pin socket 14, then the socket may include any suitable number and arrangement of pins. For example, as shown in FIG. 2, the multiple-pin socket 14 includes a plurality of pins arranged along the edge of the PCB 120. Desirably a gap 76 separates pins P2 and P4 in order to assure sufficient insulation between pins P1 and P2, and pins P4 through P14. In particular, the gap 76, for example, may be used to provide insulation between tip and ring leads P1 and P2, and leads P4 through P14.

An electrical communication means may be slidingly disposed upon PCB finger 122 of PCB 120. The electrical communication means typically is an electronic device. As such, various electronic devices may be installed upon PCB 120 at PCB finger 122. Electrical contact is made by runners that make contact with leads such as first lead 126 and second lead 128. The electronic device is slidably disposed upon peninsular electrical lead configuration 124 as will be developed further.

Figure 3:
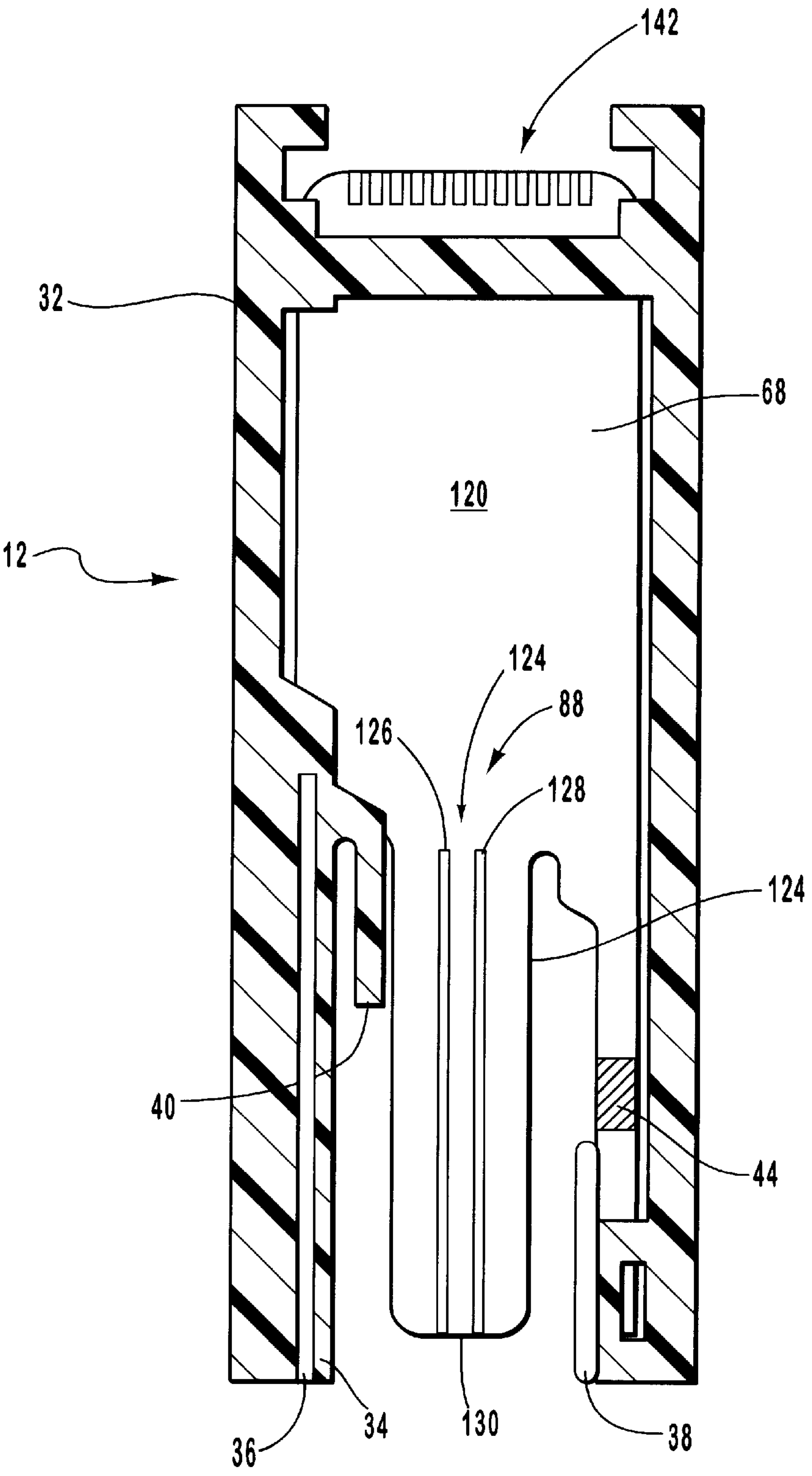
FIG. 3 is a plan view of the printed circuit board illustrated in FIG. 2 in connection with a generally U-shape.

FIG. 3 illustrates a portion of removable modular connector 12 with a frame 32 superimposed thereupon. As such, the combination of PCB 120 and frame 32 form a part of removable modular connector 12. The electronic device or slidable member that is to be slidably disposed upon peninsular electrical lead configuration 124 will fit between a gripping means such as a rail 34 and a channeling means such as an edge 38. Rail 34 is used both to guide the electronic device in its rail slot 36 and to create a locking means such as a locking mechanism to hold the electronic device in place such that it cannot be pulled out with less than 8 to 10 $lb_f$.

Edge 38 is seen from a top-down view such that the narrow width of edge 38 is within the plane of the figure. A spring guide 40 is integrally formed as part of frame 32 and has a substantially solid cylindrical shape. Spring guide 40 is viewed, however, in plan view such that it appears to be substantially rectangular. A spring (not shown) is to be placed over spring guide 40 such that an electronic device may be spring-loaded to facilitate optional removal and/or "pop-out" functionality.

Peninsular electrical lead configuration 124 may have up to eight electrical leads or more upon upper surface 68 of PCB 120. FIG. 3, as well as FIG. 2, illustrates two electrical leads as first lead 126 and second lead 128. The aspect ratio of peninsular electrical lead configuration 124 is defined as the length L beginning at or near the origin 88 of PCB finger 122 and ending at or near terminus 130 of PCB finger 122, divided by the width W defined as the left edge of the leftmost lead (first lead 126) to the right edge of the rightmost lead (second lead 128). The aspect ratio, depending upon the number of leads and length L may be about 2:1, about 4:1, about 6:1, about 8:1, about 10:1, about 12:1, about 16:1, about 18:1, and about 20:1 or greater.

Figure 4:
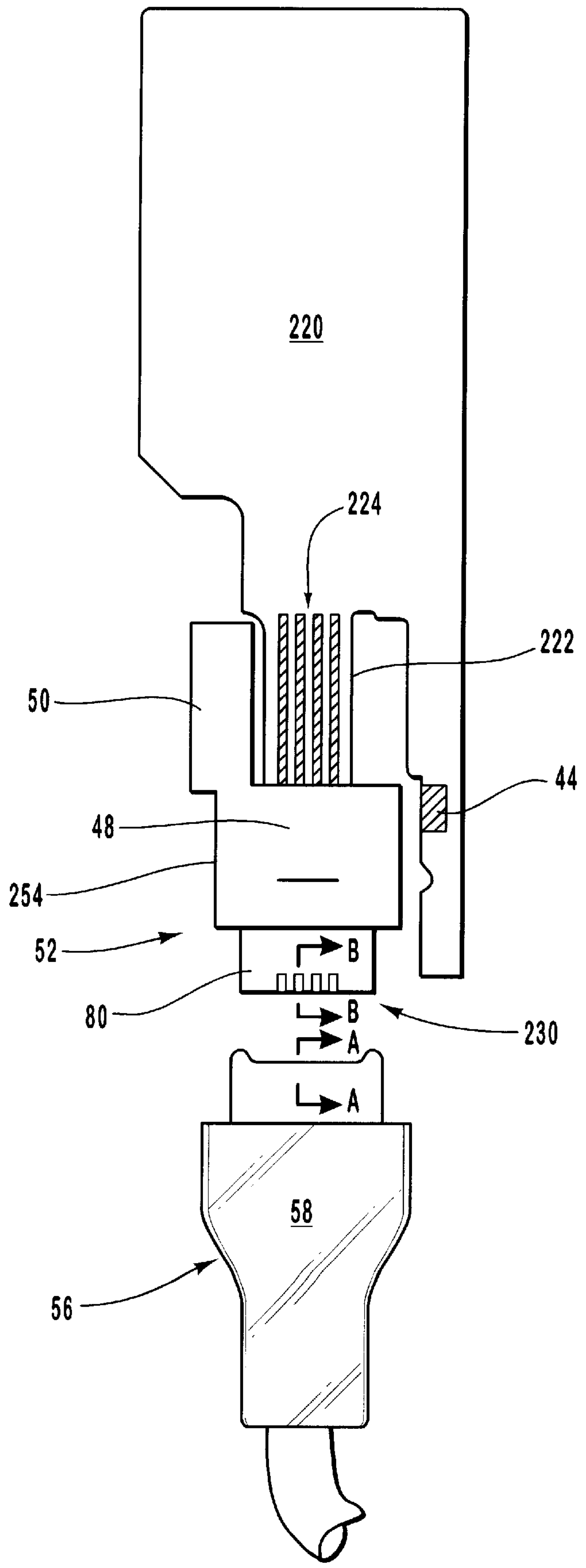
FIG. 4 is a plan view of the PCB of a removable modular connector wherein an interconnect electronic device and a cable are illustrated as being modularly connectable therewith.

FIG. 4 illustrates a portion of removable modular connector 12 and a device or member 52 illustrated as covering a portion of a PCB finger 222 of a PCB 220. It can be seen that the device 52 includes a device body 254 that includes two generally rectangular shapes, a first generally rectangular portion 48 and a second generally rectangular portion 50, but the body may have any suitable configuration. The first and second generally rectangular portions preferably intersect substantially orthogonally upon one corner each thereof.

Another embodiment of the present invention includes the provision of a light source 44 mounted upon PCB 120, 220. Light source 44 may be a light emitting diode (LED) and the like. Light source 44 may also be an incandescent light, and the like. Light source 44 may be configured to shine substantially perpendicularly onto an electronic device such as that which substantially comprises device 52. The electronic device makes contact with peninsular electrical lead configuration 224, substantially comprises device 52, and may have a housing, a shell, or a portion thereof which is translucent. As such, the translucent portion thereof may act as a light pipe to receive light energy from light source 44 and to redirect the light energy through the electronic device in the direction of terminus 230 of PCB finger 222. As such, visible light may be seen emanating from removable modular connector 12 that substantially fills device 52. An alternative embodiment includes the translucent structure that comprises device 52 without light source 44.

The removable modular connector 12, in a preferred embodiment, is particularly useful in connection with electronic devices such as a PCMCIA card. Desirably, the removable modular connector 12 is sized and configured to generally fit within the standard plan-view footprint of a PCMCIA card. Plan-view footprint standardization according to the present invention provides that any electronic device that makes contact with peninsular electrical lead configuration 124, 224 may have substantially the same device footprint of first rectangle 48 intersected by second rectangle 50 regardless of the type of electronic device. Generally speaking, this standardization of the footprint of device 52 is understood to be that portion of any electronic device that is insertable along peninsular electrical lead configuration 124, or 224 of PCB finger 122, 222 of PCB 120, 220.

Generally speaking, first rectangle 48 contains the majority of the electronic structure of the electronic device and provides physical connection to edge 38 and second rectangle 50 provides physical connection to rail 34 and to rail slot 36. That portion of the electronic device that is second rectangle 50 may be configured in connection with rail 34 and rail slot 36 to form a locking means to secure the electronic device in contact with peninsular electrical lead configuration 124.

Alternatively, removable connector 12 itself may have a means of fastening to a rail and rail slot that is mounted within a larger device such as thin-architecture communications card 10. As such, a sidewall 78 (FIG. 1) of removable connector 12 would be the location for mounting thin-architecture communication card 10 upon a rail and rail slot that would be part of the larger structure of thin-architecture communications card 10. Thus, removable connector 12 may contain within itself rail 34 and rail slot 36, and a second rail and rail slot upon which removable connector 12 would be mounted at sidewall 78. Alternatively, only one occurrence of a rail and rail slot may be embodied within the invention; either within removable connector 12 or as part of thin-architecture communications card 10 at sidewall 78.

The locking means may have at least one, and preferably two locking mechanisms that securely hold the electronic device in thin-architecture communications card 10. The configuration of at least one, and preferably two locking mechanisms is set forth in U.S. Pat. Nos. 5,338,210 and 5,183,404 the disclosures of which are incorporated herein by specific reference.

Any portion of an electronic device that is not insertable within the geometry of thin-architecture communications card 10 or the like, will extend beyond terminus 130, 230 of PCB finger 122, 222 of PCB 120, 220. As such, that portion that extends therebeyond is generally exposed to the user's view. For example, a connector such as a jack, coupling, port, etc., may be attached to the device body 254; and the connector may be positioned within the geometry of the communication card or the connector may extend outside of the geometry of the card. Thus, the connector may be positioned generally within the communication card, or all or a portion of the connector may extend outwardly from the card. For instance, FIG. 4 illustrates an exemplary connector such as a lead connector 80 that is attached to the device body 254. The connector 80 may be positioned inside the communication card or the connector may protrude outwardly from the card, as desired. It can also be seen that peninsular electrical lead configuration 224 comprises four leads that are electronically connected to the four leads depicted at lead connector 80.

A cable 56 is insertable at lead connector 80 to make electronic communication with device 52. Cable 56 has a cable body 58 that may also be made at least partially of translucent material such that light emanating from light source 44 may be piped through device body 254, into cable body 58 and emanating out of cable body 58 after a manner that is visible to the user. As such, device diagnostics may be visible to the user such as illumination, multi-colored illumination, intermittent illumination such as blinking, and multi-colored intermittent illumination such as blinking of more than one light color.

Figure 5:
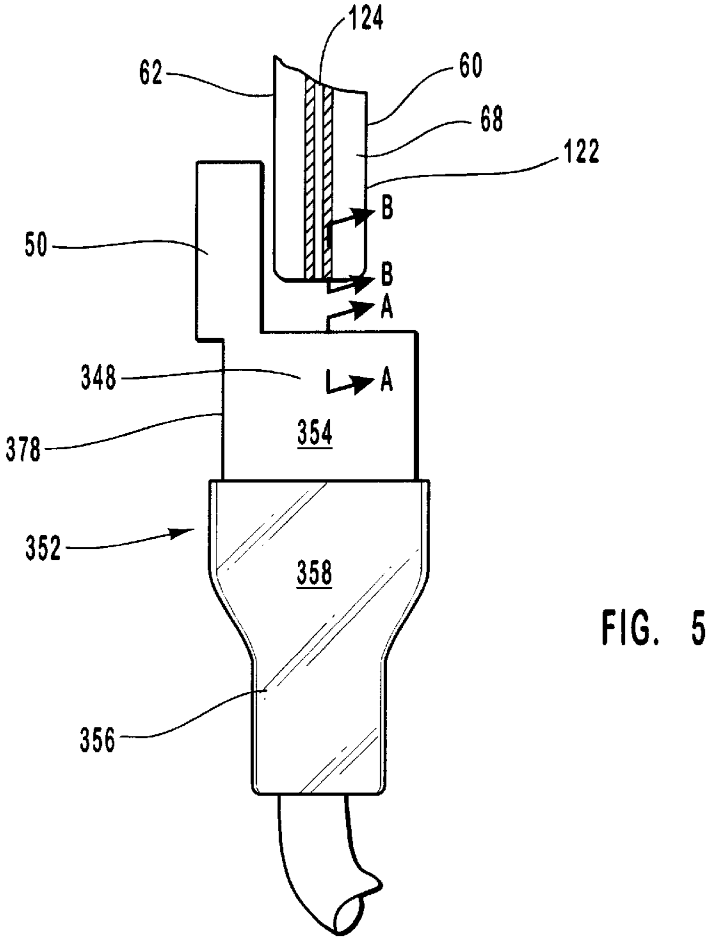
FIG. 5 is a plan view illustration of the PCB finger housed within the removable modular connector, wherein it can be seen that an electronic device is integrally formed within a cable body and a cable that is insertable upon the finger of the PCB of the removable modular connector.

In another embodiment of the present invention, removable connector 12 or the electronic device that is insertable into removable connect 12 may be integrally connected to the cable. As seen in FIG. 5, a cable 356 is seen in top plan view comprising a cable body 358 and a device body 354. Device body 354 is made of two parts including a first rectangle 348. It also includes second rectangle 50 as has been described previously. It can be seen that peninsular electrical lead configuration 124 upon PCB finger 122 comprises two electrical leads, although more leads could be found upon upper surface 68 of PCB finger 122 of PCB 120 and upon the lower surface 70 of PCB finger 122 of PCB 120. As can be seen, device body 354 is integral with cable 356. As such, device 352 may be as simple as an interconnect between a PCMCIA card and an external device or it may itself have complex electronic circuitry within device body 354 as a stand-alone electronic device that also makes electronic communication through cable 356.

Although device body 354 includes the presence of second rectangle 50, an alternative embodiment of device body 354 includes the absence of second rectangle 50. In this embodiment, the absence of second rectangle 50 may comprise an electronic device that is inserted into removable connector 12, or the absence of second rectangle 50 may mean that device 352 and cable 356 comprise a cable and removable connector 12 that are an integral unit. As such, a locking means along sidewall 378 may be provided in lieu of second rectangle 50, as described above.

Under the present geographical restrictions of a thin-architecture communications card, the size of removable connector 12 will have a plan-view footprint dimension of approximately 25 mm×50 mm. Where side-by-side jacks are insertable within removable connector 12, the lateral dimension will be approximately double 25 mm. As such, the entire front portion of thin-architecture communications card 10 (that end opposite 68-pin socket 16) would be taken up by removable connector 12.

Figure 6:
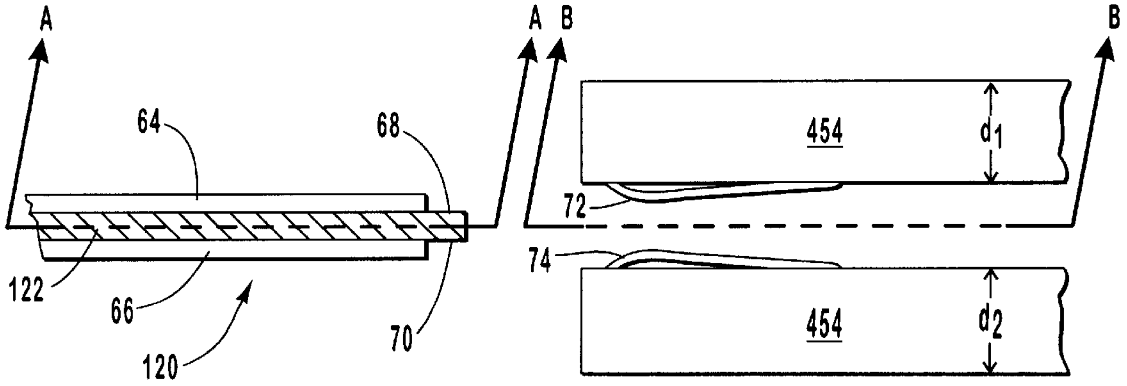
FIG. 6 is an elevational cross-section view of an alternative embodiment illustrated in FIGS. 4 and 5, wherein it can be seen that both the upper surface and the lower surface of the PCB found within the removable modular connector may include electrical traces and corresponding electrical runners on the device body that are configured to make electrical contact therewith.

FIG. 6 is a cross-section elevation view of alternative structures depicted in FIGS. 4 and 5 as taken along the dashed lines A—A and B—B. It can be seen that PCB finger 122 has at least two electronic leads configured upon upper surface 68 of PCB 120 and lower surface 70 of PCB 120 as an upper trace 64 and a lower trace 66, respectively. Where upper trace 64 and lower trace 66 are seen only in cross-section as two single traces, it is to be understood that both upper surface 68 and lower surface 70 may have anywhere between one and eight occurrences or more of upper trace 64 and lower trace 66, respectively. As an example thereto, upper surface 68 may contain a single occurrence of upper trace 64 and lower surface 70 may include a single occurrence of lower trace 66. As such, upper trace 64 and lower trace 66 may act as the tip and ring leads for a PCMCIA card. Further, upper trace 64 and lower trace 66 may be substantially not coplanar in a vertically oriented plane such that, for example upper trace 64 may be found near a first edge 60 of PCB finger 122 and lower trace 66 may be found near a second edge 62 of PCB finger 122. As such, the distance between upper trace 64 and lower trace 66 is maximized.

Another embodiment of the present invention provides for tip and ring leads to be found upon either upper surface 68 or lower surface 70, and as many as eight leads or more to be found upon the opposite surface. Another embodiment provides for as many as eight leads or more upon upper surface 68 and as many as eight leads or more upon lower surface 70. Another embodiment provides for as many as eight leads or more upon either upper surface 68 or lower surface 70 and seven, or six, or five, or four, or three, or two, or even one lead to be found upon the other surface. This configuration is preferred where a single or at least two leads carry a substantially higher voltage than the other leads and a spacing is needed as electrical insulation. Another embodiment of the present invention provides for separating at least one higher voltage lead per surface of PCB 120 upon PCB finger 122 from other leads. As such, as many as seven leads each or more may be found upon both upper surface 68 and lower surface 70 where a gap is provided between the higher voltage lead and the other leads.

In FIG. 6, it can also be seen that device body 454 (which may also be device body 254 or cable body 58 or 358) has an upper runner 72 and a lower runner 74. Upper runner 72 and lower runner 74 are configured to slidably contact upper trace 64 and lower trace 66 if either or both are present. The aforementioned trace combinations, spacings, and configurations are also applicable to corresponding combinations, spacings and configurations of occurrences for upper runner 72 and lower runner 74. Additionally, a standardized device body with as many as eight occurrences or more of upper runner 72 and as many as eight occurrences or more of lower runner 74 may be provided wherein selected runners are simply dummy runners in that no electronic connection is completed.

It can also be seen that device body 454 has two dimensions $d_1$ and $d_2$. Although $d_1$ and $d_2$ appear to be substantially equivalent in length, a preferred embodiment provides for $d_1$ to be substantially greater than $d_2$ such that the bulk of the electronic circuitry contained in device body 454 is within the bounds measured by $d_1$. Where $d_1$ and $d_2$ are substantially equal, a preferred embodiment is where device body 454 is substantially a simple electronic interconnect that plugs into removable connector 12. Another preferred embodiment provides for $d_2$ to be substantially greater than $d_1$ such that the bulk of the electronic circuitry contained in device body 454 is within the bounds measured by $d_2$. In any embodiment, PCB finger 122 of PCB 120 is preferably suspended mid-air so that lower runner 74 slidably contacts lower trace 66 without jamming against terminus 130 of PCB finger 122.

Examples of preferred electronic devices for the present invention include interconnects such as an RJ-11 jack, an RJ-45 jack, a four-pin connector, an eight-pin connector and the like. These jacks may be "pop-out" types such that light emanating from light source 44 is piped through the device body and made visible to the user when the jack is extended.

Figure 7A:
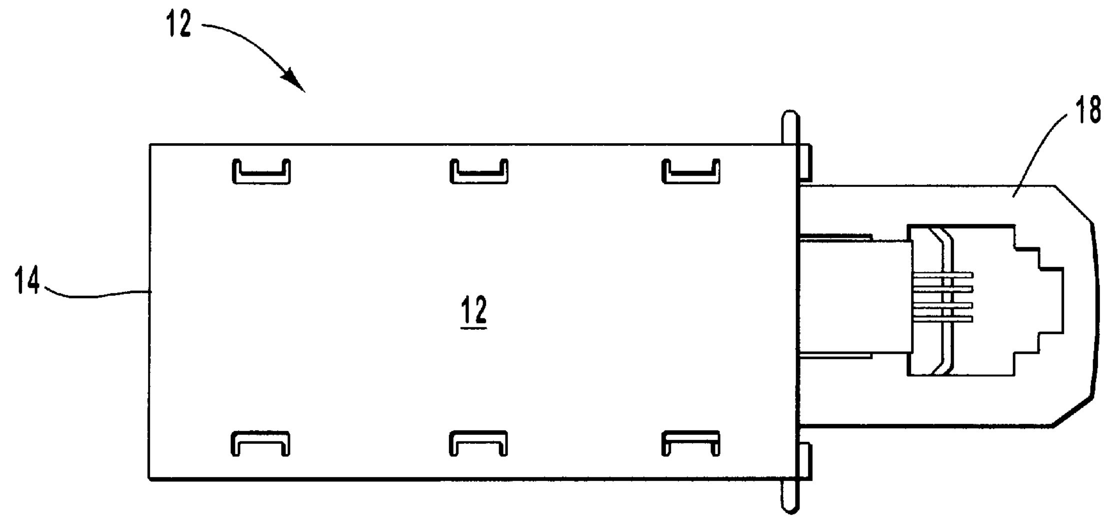
FIG. 7A is a plan view of the removable modular connector that has an RJ-11 jack interconnect therein.
Figure 7B:
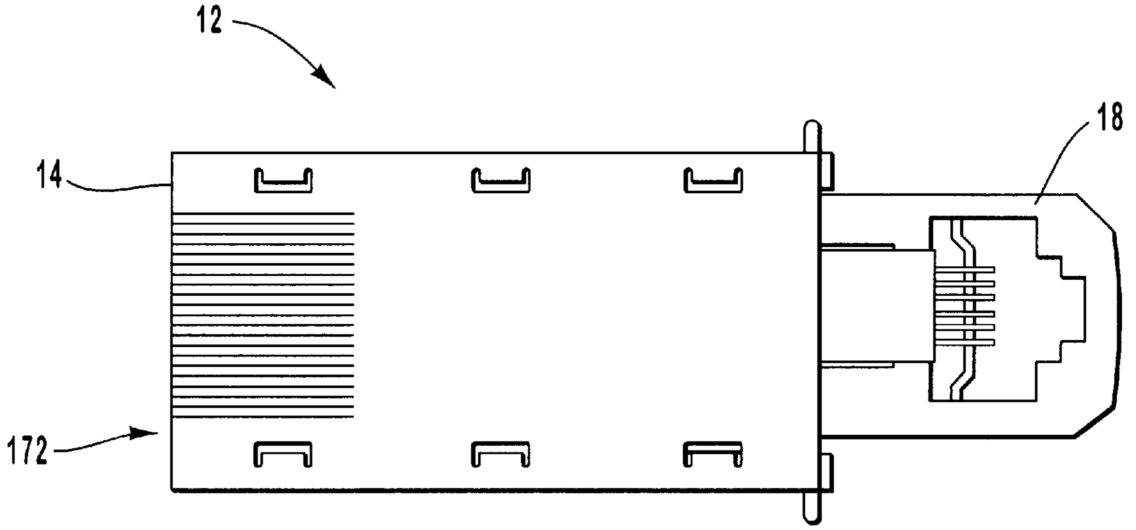
FIG. 7B is a bottom-side plan view of the removable modular connector depicted in FIG. 7A.

An example of an RJ-11 jack or an RJ-45 jack is illustrated in FIGS. 7A and 7B, wherein it can be seen that removable connector 12 has multiple-pin socket 14 at one end and jack 18 at the other end. FIG. 7B illustrates the underside of removable connector 12, seen in plan view, wherein it can be seen that a series of runners 172 are configured so as to make contact with PCB 20. As such, runners 172 or multiple-pin socket 14 can make electronic contact to PCB 20. The dimensions of removable connector 12 for this embodiment is approximately 25 mm in width and approximately 50 mm in length when jack 18 is pushed to recess entirely inside removable connector 12.

Figure 8:
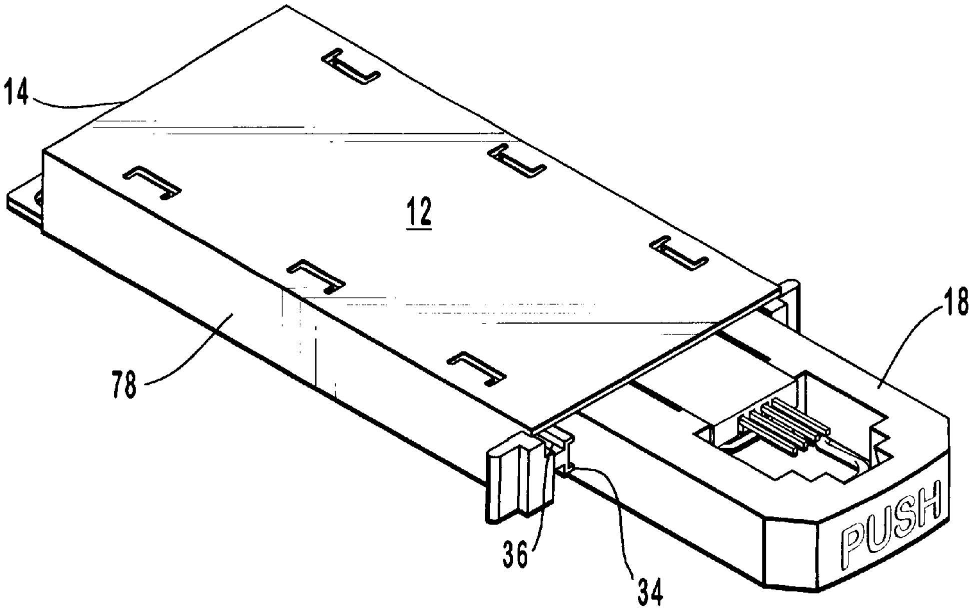
FIG. 8 is a perspective view of the removable modular connector depicted in FIGS. 7A and 7B.

FIG. 8 illustrates removable connect 12 in a perspective view, wherein it can be seen that a portion of rail 34 and rail slot 36 are illustrated. As previously discussed, it is to be understood that sidewall 78 may also be configured to fasten to a rail and rail slot that would be integral with thin-architecture communication card 10.

Figure 9:
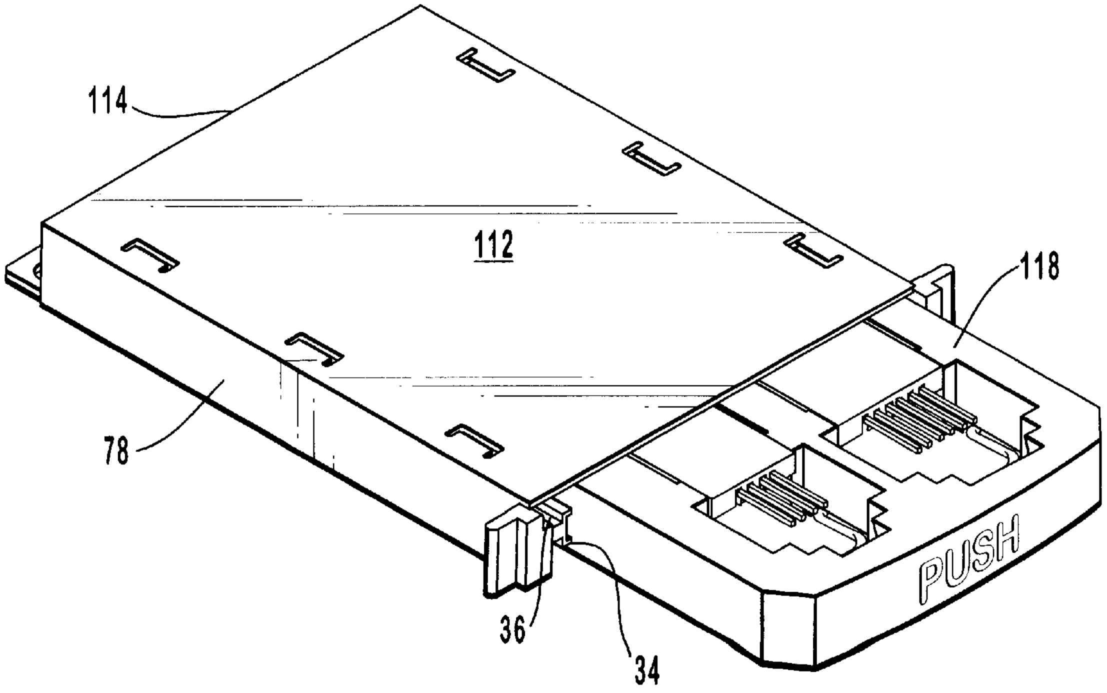
FIG. 9 is a perspective view of another embodiment of the present invention, wherein both an RJ-11 and an RJ-45 jack are configured within the removable modular connector.

FIG. 9 illustrates another embodiment of the present invention wherein a removable connect 112 with a multiple-pin socket 114 and a jack 118 is configured. Therein, it can be seen that both an RJ-11 and an RJ-45 jack are provided. It is also to be understood that sidewall 78 may be located on either side of removable connect 12, 112, etc. and the location of sidewall 78 to act as a connection means for a rail and rail slot would depend upon the particular configuration of the thin-architecture communications card. Connection of removable connect 112 to PCB 20 is either through a multiple-pin socket 214 or through runners 172 or a combination of both.

Figure 10:
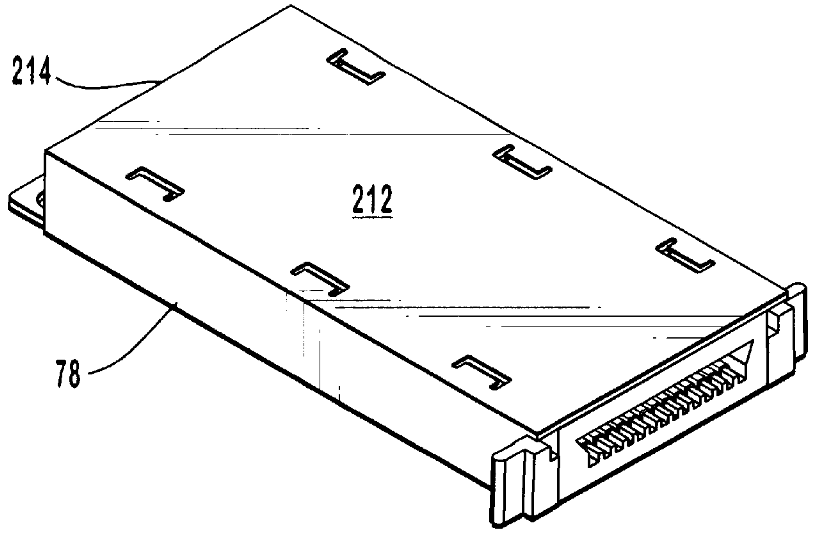
FIG. 10 is a perspective view of a removable modular connector according to the present invention, wherein a LAN connection and its circuitry is housed within the removable modular connector.

Another embodiment of the present invention as seen in FIG. 10, Local Area Network (LAN) is a removable connect 212. Within LAN removable connect 212, the conventional circuitry for an LAN electronic device is provided. Connection of LAN removable connect 212 to PCB 20 is either through a multiple-pin socket 214 or through runners 172 or a combination of both.

Figure 11:
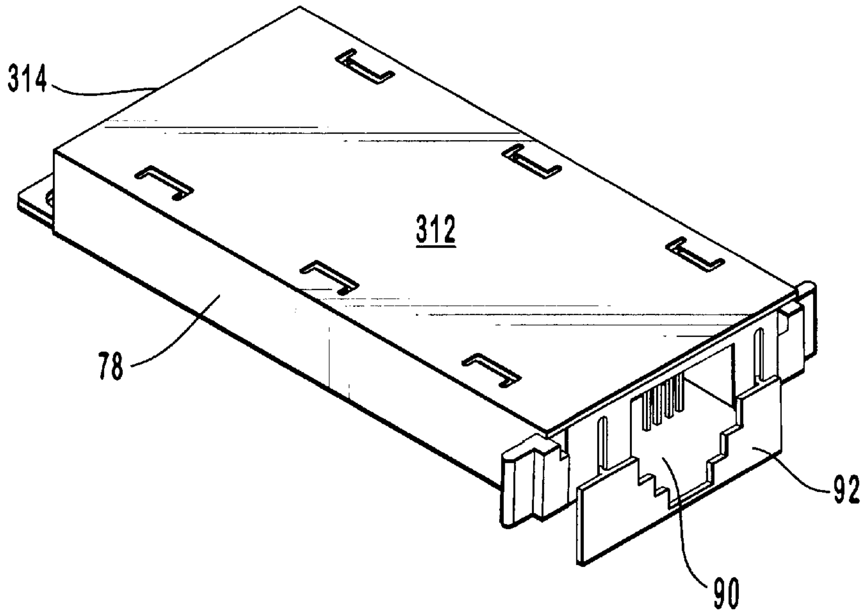
FIG. 11 is a perspective view of another embodiment, wherein a sliding door is moved to create an aperture for a jack such as an RJ-11 jack.

FIG. 11 is another embodiment of the present invention wherein a removable connect jack 312 has a multiple-pin socket 314 disposed at one end thereof and a sliding-gate aperture 90 comprising a sliding gate 92. Connection of removable connect jack 313 to PCB 20 is either through a multiple-pin socket 214 or through runners 172 or a combination of both.

Figure 12:
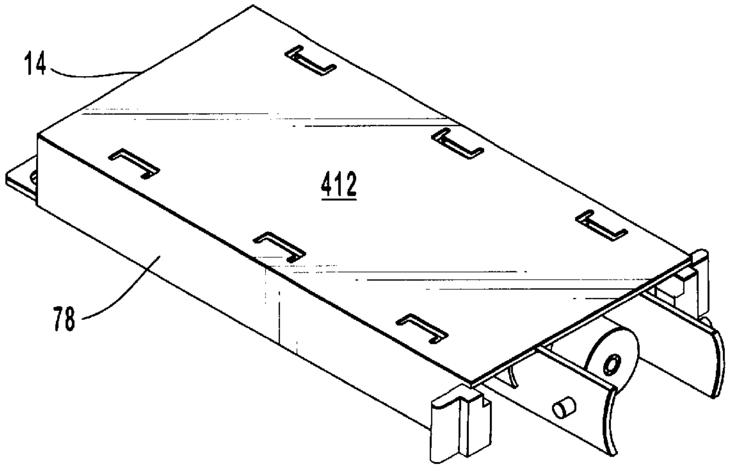
FIG. 12 is a perspective view of a removable modular connector that is configured to receive a coaxial cable.
Figure 13:
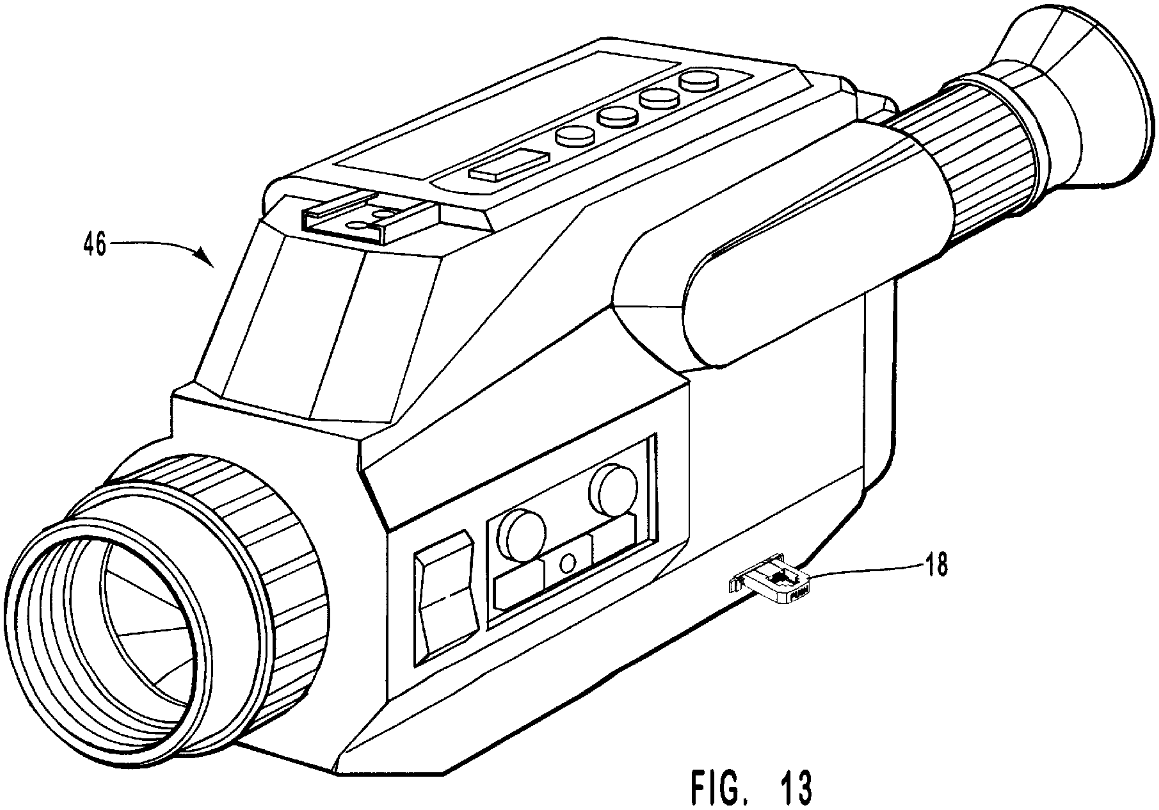
FIG. 13 is a perspective view of a video camera with a removable modular connector and an RJ-11 jack disposed within the removable modular connector.

Another embodiment of the present invention is illustrated in FIG. 12 as a coaxial cable removable connect 412. Another embodiment of the present invention is illustrated in FIG. 13 as a camcorder 46 that has jack 18 illustrated as an RJ-11 or RJ-45 jack that is insertable and provided in "popout" configuration. Connection of coaxial cable removable connector 412 to PCB 20 is either through a multiple-pin socket 214 or through runners 172 or a combination of both.

Another example of a preferred electronic device is an IRDA transceiver. The IRDA transceiver has runners that make electrical contact with peninsular electrical lead configuration 124 and is also slidably disposed thereupon. In this embodiment, the presence of second rectangle 50 as a portion of removable connector 12 is optional. The IRDA transceiver may preferably have the presence of second rectangle 50 to provide for "pop-out" capability that also has the advantage of locking mechanisms that interconnect with rail 34. As set forth above, rail 34 may be configured as part of thin-architecture communications card 10 such that removable connector 12 mounts at sidewall 78 upon rail 34. Additionally, light emanating from light source 44 may be piped through the IRDA transceiver so as to be visible to the user to provide a visible diagnostic as set forth above.

Another example of removable connector 12 is an electronic video interface. Such an electronic device may include jack 18 as seen in FIG. 13. Alternatively, the video interface may have device body with electronic video circuitry found therein and with leads that continue through cable body 58, 358 to a device such as a camcorder, a video cassette player, or a video cassette receiver. In this embodiment as in other embodiments, light may be generated at light source 44 and piped through translucent portions of device body 354, 454 into cable body 58, 358 such that a user-visible device diagnostic is provided as set forth above.

In all cases set forth above, connection of a specific removable connector to PCB 20 is either through a multiple-pin socket 214 or through runners 172 or a combination of both. Additionally, each specific removable connector may have at least a portion thereof that is translucent and that may convey light from light source 44. As a general alternative, PCB 120 etc., may have a peninsular electrical lead configuration without the presence of PCB finger 122. In such a case, PCB 120 would have a device that is integral thereto and also to the housing.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A removable modular connector for connecting an electronic device to a communication card, comprising:

a removable connector housing that is sized and configured to be positioned within the communication card;

a printed circuit board disposed within said connector housing, said printed circuit board including an elongated finger having a length, a width, an upper surface and a lower surface;

one or more electrical leads disposed on said elongated finger, one or more of said leads extending generally the entire length of said elongated finger; and a slidable member disposed on said elongated finger of said printed circuit board.

2. The modular connector as in claim 1, further comprising one or more runners attached to said slidable member, wherein at least one of said runners is in electrical communication with one of said electrical leads to allow electrical communication between said slidable member and said printed circuit board.

3. The modular connector as in claim 1, further comprising a frame at least partially surrounding said printed circuit board, said frame including at least one surface that contacts said sliding member.

4. The modular connector as in claim 3, further comprising a locking mechanism that releasably locks said slidable member to said frame.

5. The modular connector as in claim 1, wherein said slidable member includes a body with a generally rectangular first portion and a generally rectangular second portion.

6. The modular connector as in claim 5, wherein said first generally rectangular portion is generally orthogonally intersected at one corner by said second generally rectangular portion.

7. The modular connector as in claim 6, further comprising a frame at least partially surrounding said printed circuit board, said frame including an edge that contacts said first portion of said body and a rail that contacts said second portion of said body.

8. The modular connector as in claim 1, further comprising a communication port connected to said slidable member, said communication port being sized and adapted to receive a communication plug.

9. The modular connector as in claim 1, further comprising a jack connected to said slidable member.

10. The modular connector as in claim 1, further comprising a multiple-pin socket disposed proximate an end of said connector housing.

11. The modular connector as in claim 1, further comprising a plurality of leads disposed proximate an end of said connector housing.

12. The modular connector as in claim 1, further comprising a light source attached to said printed circuit board proximate said sliding member.

13. The modular connector as in claim 1, further comprising a coupling connected to said slidable member.

14. The modular connector as in claim 1, wherein said slidable member is removably attached to said elongated finger of said printed circuit board.

15. An apparatus which allows electrical communication to be established between a communication card and an electronic device, comprising:

a communication card including a body with an upper surface and a lower surface;

a connector housing at least partially disposed within said body of the communication card;

a frame attached to said connector housing;

a printed circuit board attached to said frame, said printed circuit board including an elongated finger with a length, a width, and an outer surface;

one or more leads on said outer surface of said elongated finger, at least one of said leads extending generally the entire length of said elongated finger; and a member including one or more runners, at least one of said runners being in electrical communication with one of said leads to allow electrical communication between said communication card and said member.

16. The apparatus as in claim 15, further comprising a communication port connected to said member, said communication port being sized and configured to receive a communication plug.

17. The apparatus as in claim 15, further comprising a coupling connected to said member, said coupling being adapted and configured to allow communication with said communication card.

18. The apparatus as in claim 15, further comprising a jack connected to said member, said jack being adapted and configured to allow communication with said communication card.

19. The apparatus as in claim 15, further comprising an edge of said frame located proximate a first side of said elongated finger and a rail of said frame located proximate a second side of said elongated finger, wherein said edge and said rail are sized and configured to contact said member.

20. The apparatus as in claim 19, wherein said member includes a body with a first portion and a second portion, said edge being sized and configured to contact said first portion, said rail being sized and configured to contact said second portion.

21. The apparatus as in claim 15, further comprising a locking mechanism that releasably locks said member to said frame.

22. The apparatus as in claim 15, further comprising a coupling attached to said connector housing, said coupling being sized and configured to allow communication with said communication card.

23. The apparatus as in claim 15, wherein said member is removably attached to said printed circuit board of said communication card.

24. The apparatus as in claim 15, further comprising a connector attached to an end of said printed circuit board, said connector electrically connected to to said communication card to allow electrical communication between said printed circuit board disposed within said connector housing and said communication card.

25. The apparatus as in claim 15, wherein said member includes a body that is at least partially translucent to allow light to pass through at least that portion of the housing.

26. The apparatus as in claim 15, wherein said member is slidably disposed on said elongated finger.

27. The apparatus as in claim 15, wherein said member is integrally attached to said elongated finger.

28. The apparatus as in claim 15, further comprising a connector attached to an end of said connector housing, said connector electrically connected to said communication card to allow electrical communication between said printed circuit board disposed within said housing and said communication card.

29. The apparatus as in claim 15, wherein said member is integrally formed with a cable body.

30. A modular connector for connecting an electronic device to an electronic communication card, comprising:

a connector housing that is sized and configured to be positioned within the communication card;

a frame generally positioned inside said connector housing;

a printed circuit board disposed within said frame, said printed circuit board including an elongated finger with a length, a width and an outer surface;

one or more electrical leads disposed on said outer surface of said printed circuit board; and a slidable member in electrical communication with one or more of said leads disposed on said elongated finger.

31. The modular connector as in claim 30, further comprising one or more runners attached to said slidable member, wherein at least one of said runners is in communication with one of said leads to allow communication between said slidable member and said printed circuit board.

32. The modular connector as in claim 30, wherein said frame has a generally U-shaped configuration with an edge proximate a first side of said elongated finger and a rail proximate a second side of said elongated finger.

33. A removable modular connector, comprising:

a printed circuit board including an elongated finger, said printed circuit board and said elongated finger including a generally planar upper surface and a generally planer lower surface, said elongated finger having a width and a length;

one or more leads disposed on said outer surface of said elongated finger, at least one of said leads extending generally the entire length of said elongated finger; and a slidable member disposed on said elongated finger, said slidable member including one or more runners, at least one of said runners being in electrical communication with one of said leads to allow electrical communication between said printed circuit board and said slidable member.

34. The modular connector as in claim 33, further comprising a generally U-shaped frame surrounding said printed circuit board, an edge of said frame being located proximate a first side of said elongated finger and a rail of said frame being located proximate a second side of said elongated finger.

35. The removable modular connector as in claim 34, further comprising a housing, said frame and said printed circuit board being substantially disposed within said housing.

36. The removable modular connector as in claim 34, further comprising means for locking the slidable member to the frame.

37. An apparatus that allows electrical communication to be established with an electronic device, comprising:

a housing;

a U-shaped frame generally positioned within said housing;

a printed circuit board substantially disposed within said U-shaped frame, said printed circuit board including an elongated finger with a length, a width and an outer surface;

one or more leads located on said outer surface of said elongated finger; and a slidable member disposed on said elongated finger, said slidable member including one or more runners, at least one or said runners being in electrical communication with one of said leads to allow electrical communication between said electronic device and said slidable member.

38. The apparatus as in claim 37, further comprising a locking mechanism that releasably locks said slidable member in communication with said elongated finger.

* * * * *

UNITED STATES PATENT AND TRADEMARK OFFICE

CERTIFICATE OF CORRECTION

PATENT NO. : 6,135,786 
DATED : October 24, 2000
INVENTOR(S) : Thomas A. Johnson, David D. Oliphant It is certified that error appears in the above-identified patent and that said Letters Patent is hereby corrected as shown below:

Column 2,
Line 60, please change "the connect" to -- the connector --

Column 3,
Line 42, please change "the connect" to -- the connector --

Column 5,
Line 40, please delete "removable connect"

Column 10,
Line 65, please change "313" to -- 312 --

Column 14,
Line 57, please change "one or said runners" to -- one of said runners --

Signed and Sealed this

Twenty-sixth Day of February, 2002

*Attest:*

JAMES E. ROGAN

*Attesting Officer* *Director of the United States Patent and Trademark Office*